(12) United States Patent
Trickett et al.

(10) Patent No.: US 10,861,744 B2
(45) Date of Patent: Dec. 8, 2020

(54) PLATFORM AND METHOD OF OPERATING FOR INTEGRATED END-TO-END CMP-LESS INTERCONNECT PROCESS

(71) Applicant: Tokyo Electron Limited, Tokyo (JP)

(72) Inventors: Ying Trickett, Albany, NY (US); Kai-Hung Yu, Albany, NY (US); Nicholas Joy, Albany, NY (US); Kaoru Maekawa, Albany, NY (US); Robert Clark, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/356,272

(22) Filed: Mar. 18, 2019

(65) Prior Publication Data

US 2019/0295887 A1    Sep. 26, 2019

Related U.S. Application Data

(60) Provisional application No. 62/645,685, filed on Mar. 20, 2018, provisional application No. 62/787,607, (Continued)

(51) Int. Cl.
*H01L 21/76* (2006.01)
*H01L 21/768* (2006.01)
(Continued)

(52) U.S. Cl.
CPC ...... *H01L 21/76879* (2013.01); *G05B 13/027* (2013.01); *G05B 19/41875* (2013.01); *H01L 21/0228* (2013.01); *H01L 21/02271* (2013.01); *H01L 21/28562* (2013.01); *H01L 21/31116* (2013.01); *H01L 21/67023* (2013.01); *H01L 21/67063* (2013.01); *H01L 21/67161* (2013.01); *H01L 21/67167* (2013.01); (Continued)

(58) Field of Classification Search
CPC ........................... H01L 21/0228; H01L 21/32
See application file for complete search history.

(56) References Cited

U.S. PATENT DOCUMENTS

| | | | |
|---|---|---|---|
| 2010/0267172 A1* | 10/2010 | Xiao | H01L 22/12 438/16 |
| 2017/0271149 A1* | 9/2017 | Heo | H01L 28/00 |
| 2017/0271196 A1* | 9/2017 | Manna | H01L 23/3178 |

* cited by examiner

*Primary Examiner* — Caridad Everhart
*Assistant Examiner* — Ankush K Singal
(74) *Attorney, Agent, or Firm* — Oblon, McClelland, Maier & Neustadt, L.L.P.

(57) ABSTRACT

A method of processing materials on a semiconductor workpiece using an integrated sequence of processing steps executed on a common manufacturing platform hosting a plurality of processing modules including one or more film-forming modules, one or more etching modules, and one or more transfer modules is provided. A workpiece having an upper planar surface is received into the common manufacturing platform. The method further includes conformally applying a thin film over the feature pattern using one of the film-forming modules, removing the thin film from upper surfaces of the feature pattern using one of the etching modules to leave behind the thin film in the recessed feature, and removing the fill material from the upper planar surface of the workpiece. The integrated sequence of processing steps is executed in a controlled environment within the common manufacturing platform and without leaving the controlled environment.

18 Claims, 4 Drawing Sheets

Related U.S. Application Data filed on Jan. 2, 2019, provisional application No. 62/787,608, filed on Jan. 2, 2019, provisional application No. 62/788,195, filed on Jan. 4, 2019.

(51) Int. Cl.
*H01L 21/67* (2006.01)
*H01L 21/66* (2006.01)
*H01L 21/677* (2006.01)
*H01L 21/02* (2006.01)
*H01L 21/285* (2006.01)
*H01L 21/311* (2006.01)
*G05B 13/02* (2006.01)
*G05B 19/418* (2006.01)
*C23C 14/24* (2006.01)
*C23C 14/34* (2006.01)
*H01J 37/32* (2006.01)

(52) U.S. Cl.
CPC .. *H01L 21/67184* (2013.01); *H01L 21/67196* (2013.01); *H01L 21/67225* (2013.01); *H01L 21/67253* (2013.01); *H01L 21/67276* (2013.01); *H01L 21/67288* (2013.01); *H01L 21/67703* (2013.01); *H01L 21/67742* (2013.01); *H01L 21/67745* (2013.01); *H01L 21/7685* (2013.01); *H01L 21/76802* (2013.01); *H01L 21/76831* (2013.01); *H01L 21/76832* (2013.01); *H01L 21/76834* (2013.01); *H01L 21/76897* (2013.01); *H01L 22/12* (2013.01); *C23C 14/24* (2013.01); *C23C 14/34* (2013.01); *G05B 2219/32368* (2013.01); *G05B 2219/45031* (2013.01); *H01J 37/32* (2013.01); *H01L 21/67017* (2013.01); *H01L 21/67207* (2013.01)

PLATFORM AND METHOD OF OPERATING FOR INTEGRATED END-TO-END CMP-LESS INTERCONNECT PROCESS

CROSS-REFERENCE TO RELATED APPLICATIONS

The present application claims the benefit of U.S. Provisional Application No. 62/645,685, filed on Mar. 20, 2018, entitled "Substrate Processing Tool with Integrated Metrology and Method of Using," U.S. Provisional Application No. 62/787,607, filed on Jan. 2, 2019, entitled "Self-Aware and Correcting Heterogeneous Platform incorporating Integrated Semiconductor Processing Modules and Method for using same," U.S. Provisional Application No. 62/787,608, filed on Jan. 2, 2019, entitled "Self-Aware and Correcting Heterogeneous Platform incorporating Integrated Semiconductor Processing Modules and Method for using same," and U.S. Provisional Application No. 62/788,195, filed on Jan. 4, 2019, entitled "Substrate Processing Tool with Integrated Metrology and Method of using," which are incorporated herein by reference in its entirety.

BACKGROUND OF THE INVENTION

Field of Invention

The present invention relates to a processing platform and methods for semiconductor processing using the platform, and more particularly to a platform and method for forming an interconnect without the use of chemical-mechanical planarization (CMP).

Description of Related Art

Chemical-mechanical planarization (CMP) techniques utilize planarization machinery with the assistance of chemicals to remove material from the surface of semiconductors. However the machinery and chemicals used in CMP processes may be hazardous, and even potentially harmful to the wafer being planarized due to the use of abrasive particles on the planarization machinery. Fill material is often used to fill recessed features on a surface of semiconductor workpieces, and eventually various filled features are interconnected on a single semiconductor workpiece.

Processes that avoid the use of chemical-mechanical planarization are needed to replace chemical-mechanical planarization processes and protect the integrity of the semiconductor workpiece and avoid worker exposure to harmful chemicals or hazardous mechanical tools.

Conventional CMP flow has several steps, and many CMP processes are performed on single wafer rotary polishers. The wafer is held in a rotating wafer carrier and is pressed against a rotating polymer pad on which a chemically active slurry is dispensed. The removal rates of various materials depend on the applied pressure, the kinematics, and the chemistry and particle content of the slurry and wafer. Different materials and combinations of materials on the wafer surface require different slurries in order to achieve the desired removal rate, rate selectivity between exposed materials, and the desired uniformity, surface quality, and defect count. The material properties and surface structure of the pad also affect the latter three measures. Pads and slurries are therefore critical elements of the process and together constitute a large fraction of the cost of semiconductor manufacturing.

As devices are scaled to smaller and smaller features and techniques are implemented to try and address the issues that result from scaling, it is important to monitor the fabrication process at various stages of the process flow to determine whether the feature attributes are within specification, and if not, to adjust the process to either bring the workpiece within specification or to bring subsequently processed workpieces within specification.

In conventional interconnect manufacturing, the process is performed using multiple separate stand-alone tools for high-volume manufacturing. Wafers are sequentially loaded into one tool, subjected to one process step in that tool, then removed to ambient environment and placed in queue to be loaded into the next tool, and so on until the multiple steps of the interconnect flow are complete. Time spent waiting in queue for each tool is referred to as Q-time, and high Q-times result in lower production rates. Different operations in the process flow may take different amounts of time such that throughput matching of tools is a production challenge.

Each tool in the process flow may be part of a tool cluster. For example, five identical etch tools can be clustered in combination with a transfer tool so that 5 wafers can be etched concurrently at one step of the process flow to enable high-volume production. The multiplicity of these cluster tools provides a benefit if a tool goes out of service for any reason. If 1 tool in a 5-tool cluster goes out of service for 1 week, then production can continue, albeit at only 80% capacity. Thus, each stand-alone tool in the interconnect manufacturing flow may be a cluster of identical tools to prevent an out of service tool from shutting down production completely, and clustering may be used to minimize throughput matching challenges.

In conventional interconnect manufacturing flow, if measurements are needed to determine whether the process is operating within specification, a stand-alone metrology tool may be included, where a workpiece is periodically removed from the process flow for measurements to be taken, which are often destructive measurements using a measurement pad on the workpiece, and the results can be fed back to the process flow tools for adjustments to downstream steps in the process flow, or adjustments to upstream steps for future wafers. This process involves exposure to the ambient environment, Q-time waiting for the metrology tool to be available, and lengthy measurement times for results to be obtained, such that significant time may pass before data is available to enable adjustments to be made to the process flow in either a feed-back or feed-forward manner.

Thus, the conventional approach of using multiple separate stand-alone tools (single or clustered) for high-volume manufacturing can lead to issues including but not limited to Q-time oxidation (i.e., as the wafers sit between tools waiting for their turn in the next tool, they can be subjected to oxidation from the ambient environment), defectivity from environmental exposure between tools, cost challenges due to throughput matching difficulties, temporal tool drift, and real time chamber matching (e.g., yield and EPE). Additionally, there is a need to depart from CMP processes involved in tools clusters to prevent abrasion on the workpiece and improve safety for the workers exposed to the semiconductor manufacturing process.

SUMMARY OF THE INVENTION

In one embodiment, a method of processing materials on a semiconductor workpiece is provided using an integrated sequence of processing steps executed on a common manufacturing platform hosting a plurality of processing modules including one or more film-forming modules, one or more etching modules, and one or more transfer modules. The integrated sequence of processing steps includes receiving the workpiece into the common manufacturing platform, the workpiece having an upper planar surface and at least one recessed feature therein, and depositing a fill material onto the workpiece in one of the one or more film-forming modules hosted on the common manufacturing platform such that the fill material is deposited into the recessed feature. The integrated sequence of processing steps further includes etching the workpiece in one of the one or more etching modules hosted on the common manufacturing platform to remove any fill material deposited on the upper planar surface and to leave behind the fill material in the recessed feature. The integrated sequence of processing steps further includes obtaining real-time measurement data to determine if the recessed feature is coplanar with the upper planar surface, or to determine if the fill material has been removed from the upper planar surface, or both, and repeating the depositing, etching, and obtaining until the fill material in the recessed feature is coplanar with the upper planar surface, wherein the obtaining real-time measurement data is performed in a workpiece measurement region located within a dedicated area of at least one of the one or more transfer modules or within a metrology module hosted on the common manufacturing platform. The integrated sequence of processing steps is executed in a controlled environment within the common manufacturing platform and without leaving the controlled environment, and wherein the one or more transfer modules are used to transfer the workpiece between the plurality of processing modules while maintaining the workpiece within the controlled environment.

In a related embodiment, the method is continued wherein depositing the fill material includes conformally depositing a conformal layer of the fill material along the upper planar surface and along sidewall surfaces and a bottom surface of the recessed feature, and wherein etching the workpiece includes removing the conformal layer from at least the upper planar surface while leaving the conformal layer on the bottom surface.

In a related embodiment, the method is continued wherein depositing the fill material includes selectively depositing the fill material onto a bottom surface of the recessed feature, and wherein etching the workpiece includes removing any fill material deposited as a contaminant on the upper planar surface.

In one embodiment, a method of processing materials on a semiconductor workpiece is provided using an integrated sequence of processing steps executed on a common manufacturing platform hosting a plurality of processing modules including one or more film-forming modules, one or more etching modules, and one or more transfer modules. The integrated sequence of processing steps includes receiving the workpiece into the common manufacturing platform, the workpiece having an upper planar surface and at least one recessed feature therein. The integrated sequence of processing steps further includes depositing a fill material onto the workpiece in one of the one or more film-forming modules hosted on the common manufacturing platform such that the fill material is deposited into the recessed feature. The integrated sequence of processing steps further includes etching the workpiece in one of the one or more etching modules hosted on the common manufacturing platform to remove any fill material deposited on the upper planar surface and to leave behind the fill material in the recessed feature. The integrated sequence of processing steps further includes repeating the depositing and etching until the fill material in the recessed feature is coplanar with the upper planar surface. The integrated sequence of steps is executed in a controlled environment within the common manufacturing platform and without leaving the controlled environment, and wherein the one or more transfer modules are used to transfer the workpiece between the plurality of processing modules while maintaining the workpiece within the controlled environment.

In another embodiment, a platform for performing the described methods is provided.

In another embodiment, a manufacturing platform for performing an interconnect process on a workpiece without using chemical-mechanical planarization is provided. The platform includes one or more film-forming modules and one or more etching modules. The platform further includes at least one transfer module to which the one or more film-forming modules and the one or more etching modules are mounted. The platform further includes a control system programmably configured to transfer a workpiece between the one or more film-forming modules and the one or more etching modules, while using the at least one transfer module to maintain a controlled environment, and operate the platform to fill a recessed feature without subsequently applying chemical-mechanical planarization to remove over-burden.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION OF EMBODIMENTS OF THE INVENTION

Figure 1:
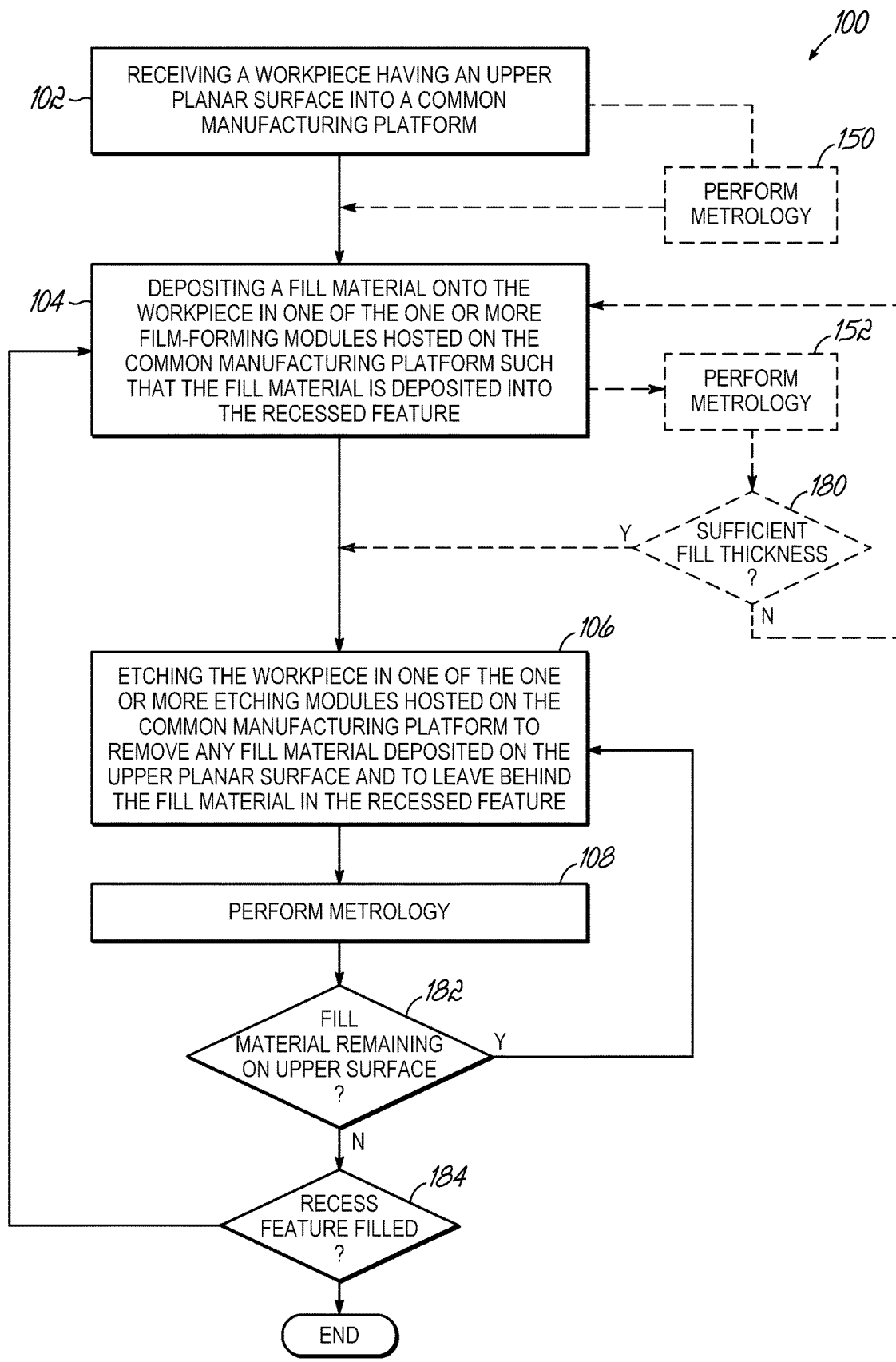
FIG. 1 is a flow chart diagram illustrating one embodiment of an integrated process flow for CMP-less interconnect manufacturing.

Methods using an integrated platform for processing materials on a semiconductor workpiece without the use of chemical-mechanical planarization (CMP) are described. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention but does not denote that it is present in every embodiment. Thus, the phrases such as "in one embodiment" or "in an embodiment" that may appear in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

The present embodiments include methods that utilize a common manufacturing platform in which multiple process steps are performed on the common platform within a controlled environment, for example, without breaking vacuum between operations. The integrated end-to-end platform includes both etching modules and film-forming modules and is configured to transfer a workpiece from one module to another while maintaining the workpiece in a controlled environment, e.g., without breaking vacuum or leaving an inert gas protective environment, and thus avoiding exposure to an ambient environment. Any of a number of processes may be carried out on the common manufacturing platform, and the integrated end-to-end platform will enable high-volume manufacturing at reduced cost with improvement to yield, defectivity levels and EPE.

As used herein, "module" generally refers to a processing tool with all of its hardware and software collectively, including the process chamber, substrate holder and movement mechanisms, gas supply and distribution systems, pumping systems, electrical systems and controllers, etc. Such details of the modules are known in the art and therefore not discussed herein.

As used herein, a "film-forming module" refers to any type of processing tool for depositing or growing a film or layer on a workpiece in a process chamber. The film-forming module may be a single wafer tool, a batch processing tool, or a semi-batch processing tool. The types of film deposition or growth that may be performed in the film-forming module include, by way of example and not limitation, chemical vapor deposition, plasma-enhanced or plasma-assisted chemical vapor deposition, atomic layer deposition, physical vapor deposition, thermal oxidation or nitridation, etc., and the process may be isotropic, anisotropic, conformal, selective, blanket, etc.

As used herein, an "etching module" refers to any type of processing tool for removing all or a portion of a film, layer, residue or contaminant on a workpiece in a process chamber. The etching module may be a single wafer tool, a batch processing tool, or a semi-batch processing tool. The types of etching that may be performed in the etching module include, by way of example and not limitation, chemical oxide removal (COR), dry (plasma) etching, reactive ion etching, wet etching using immersion or non-immersion techniques, atomic layer etching, chemical-mechanical polishing, cleaning, ashing, lithography, etc., and the process may be isotropic, anisotropic, selective, etc.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein the term "workpiece" may more generally refer to a composition of materials or layers that are formed on a substrate during one or more phases of a semiconductor device manufacturing process, the workpiece ultimately comprising the semiconductor device(s) at a final stage of the processing. In any regard, the terms 'workpiece" "substrate" or "wafer" are not limiting to the invention.

As used herein, the term "CMP-less" is a descriptive term indicating that the modified noun does not involve chemical-mechanical planarization or chemical-mechanical polish.

"Controlled environment" as used herein refers to an environment in which the ambient atmosphere is evacuated and either replaced with a purified inert gas or a low-pressure vacuum environment. A vacuum environment is well below atmospheric pressure and is generally understood to be $10^{-5}$ Torr or less, for example $5 \times 10^{-8}$ Torr or less.

The present embodiments include methods for CMP-less processing that utilize a platform of processing modules and tools configured for performing integrated substrate processing and substrate metrology, and methods of processing a substrate or workpiece. Herein, the workpieces that are the subject of processing may be referred to as 'workpiece" "substrate" or "wafer." The workpieces being processed remain under vacuum. That is, measurement/metrology processes and modules are integrated together with processing modules and systems, processing chambers and tools, and overall manufacturing platforms to be utilized before, during or after processing, in a vacuum environment for collecting data associated with an attribute on a workpiece, such as attributes of the workpiece surfaces, features, and devices thereon. The collected measurement/metrology data is then utilized to affect the processing steps, the processing module operation, and overall processing system, in real time with respect to the processing steps. The invention will correctively adapt or tune, or otherwise affect, one or more of the processing steps/processing modules of the system to keep the substrate in specification or to correct features or layers out of specification. The system steps and modules are not only affected going forward in the processing, but also previous processing steps and modules may be adapted through feedback in the system to correct a processing step or process chamber for future substrates. The invention may process the substrate through the most recent processing step, such as an etch step or film forming or deposition step, and then immediately collect measurement/metrology data. As used herein, measurement data/steps and metrology data/steps are referred to synonymously to generally mean data measured in accordance with the invention. The data is then processed to detect non-conformities or defects, and a future processing step may be affected to take any necessary corrective action to address a substrate found to be out of specification or defective in some manner. A future processing step, for example, might include returning the substrate to the immediately previous processing module, affecting a future processing step in another processing chamber to address the measurement/metrology data or introducing one or more additional processing steps in the processing sequence to bring the substrate back into specification. If the metrology data determines that the substrate may not be further processed to bring it into specification or to correct a non-conformity it might be ejected from the manufacturing platform much earlier in the process to avoid unnecessary further processing.

For purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Figure 2:
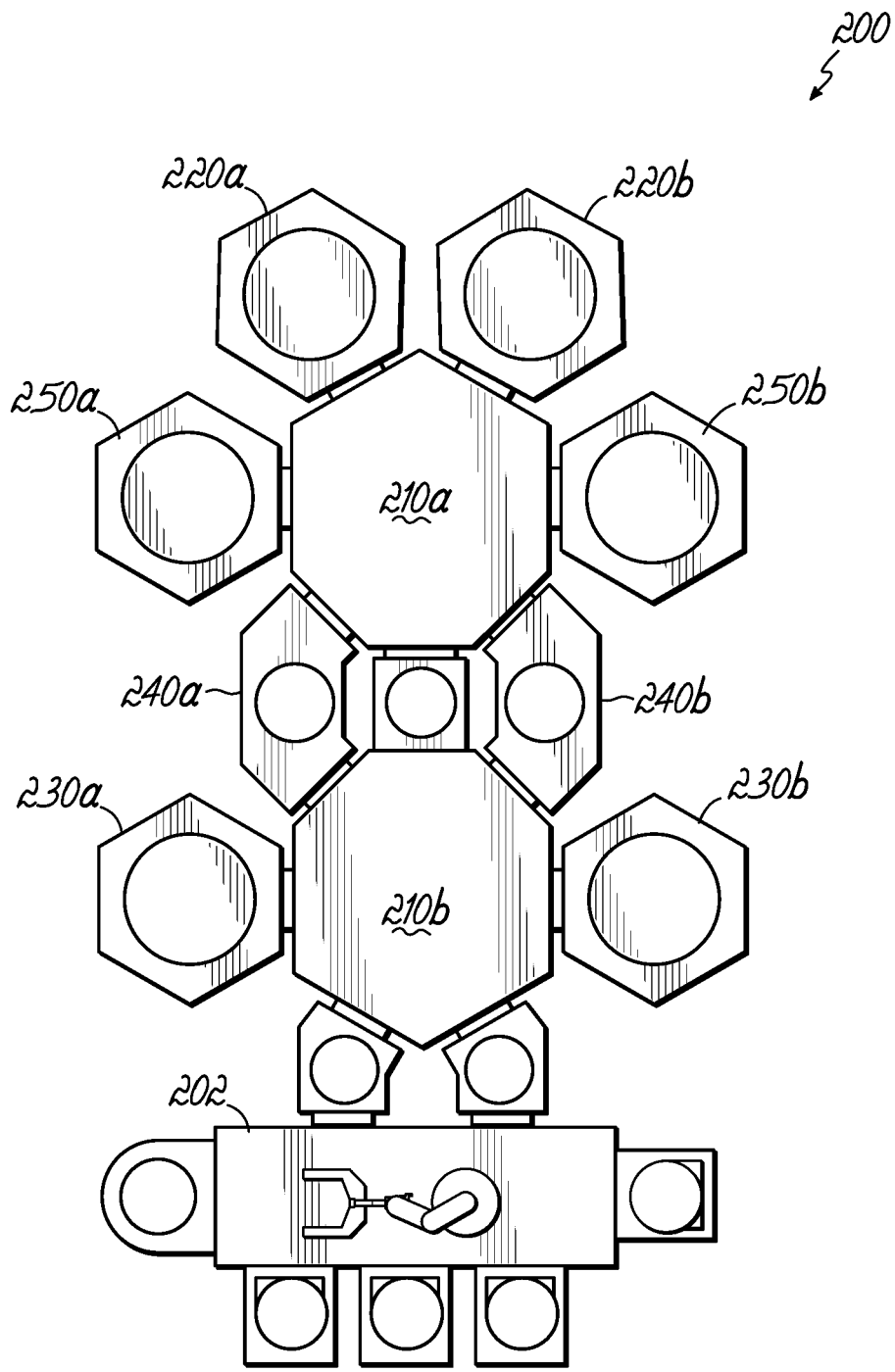
FIG. 2 is a schematic diagram illustrating one embodiment of a common manufacturing platform for performing a CMP-less interconnect manufacturing method.

FIG. 1 illustrates a flowchart of a CMP-less interconnect method for a semiconductor workpiece and FIG. 2 illustrates an example of a common manufacturing platform that may be used to perform the CMP-less interconnect method. FIGS. 3A-3E are schematic cross-sectional diagrams illustrating one embodiment of a CMP-less interconnect manufacturing method, and FIGS. 4A-4E are schematic cross-sectional diagrams illustrating another embodiment of a CMP-less interconnect manufacturing method.

In operation 102 of process flow 100, a workpiece having an upper planar surface and at least one recessed feature formed therein is received into the common manufacturing platform 200.

FIG. 2 illustrates an example of a common manufacturing platform 200. The processing modules may include, among other things, a front end module 202, transfer modules 210a, 210b, deposition modules 220a, 220b, etch modules 230a, 230b, and cleaning modules 250a, 250b. The front end module 202 may be used to perform operation 102, and bring the workpiece into the controlled environment of the common manufacturing platform 200, on which the controlled environment is maintained throughout the process flow 100. The controlled environment may include a vacuum environment, where each operation in the process flow 100 is conducted without breaking vacuum, or an inert gas atmosphere, or a combination thereof. A single transfer module may be coupled between each processing module or tool, or separate transfer modules may be used for each tool transfer. Transfer modules 210a-210b, shown in FIG. 2, may be collectively referred to herein as transfer modules 210 where appropriate. Where different processing modules on the common manufacturing platform 200 require different controlled environments, such as different vacuum pressures or vacuum in one module followed by a module with inert gas atmosphere, multiple transfer modules 210 may be used where the transfer modules 210 assist in implementing the transitions between the different controlled environments. While a single transfer module may be useful in a cluster-type tool where same-type processing modules are positioned in a circle around the transfer module, multiple transfer modules 210 may be more appropriate in an end-to-end platform configuration with different processing module types. FIG. 2 illustrates an example of a hybrid of cluster-type and end-to-end platform configurations. The embodiments herein do not preclude an end-to-end platform configuration that utilizes a single transfer module that is coupled to each of the processing modules, or some other hybrid configuration, for example, a common transfer module for adjacent same-type processing modules that are used in sequence, such as shown in FIG. 2.

The front end module (FEM) 202 may incorporate one or more cassettes holding the workpieces. The front end module 202 may be maintained at atmospheric pressure but purged with an inert gas to provide a clean environment. One or more of the substrates may then be transferred into a transfer module 210b, such as through one or more load lock chambers (not shown) as discussed herein.

The transfer modules 210a, 210b of FIG. 2 may be transfer measurement modules (TMM) that include measurement tools or inspection systems integrated therein for capturing data from a workpiece. Multiple TMM's, 210a, 210b may be interfaced for providing movement of a workpiece through a desired sequence. The transfer measurement modules 210a, 210b may be coupled with a plurality of processing modules. Such processing modules may provide various different processing steps or functions and may include one or more etch modules 230a, 230b, one or more deposition modules 220a, 220b, one or more cleaning modules 250a, 250b, and one or more measurement modules 240a, 240b.

Alternatively, the transfer modules 210a and 210b may be transfer modules without measurement tools or inspection systems. Multiple of these transfer modules 210a, 210b may be interfaced for providing movement of a workpiece through a desired sequence. The transfer modules 210a, 210b may be coupled with a plurality of processing modules. Such processing modules may provide various different processing steps or functions and may include one or more etch modules 230a, 230b, one or more deposition modules 220a, 220b, one or more cleaning modules 250a, 250b, and one or more measurement modules 240a, 240b.

Alternatively or in addition, measurement tools and instrumentation may be located in a measurement modules 240a, 240b, separate from or included in the transfer modules 210a, 210b, or TTMs 210a, 210b, as the case may be. The measurement modules 240a, 240b may be accessed through the transfer modules 210a, 210b before or after each processing step. In one embodiment, the measurement modules 240a, 240b, are located outside of the transfer modules 210a, 210b, as shown in FIG. 2, and are accessed to insert and receive workpieces similar to the various processing modules. Alternatively, measurement modules or at least a portion thereof (not shown) may be located in a respective transfer module 210a, 210b. More specifically, all or a portion of a measurement module may be located in transfer module 210a, 210b to define a measurement region where a workpiece may be positioned for measurement during a transfer process. The measurement region is located in a dedicated area of the transfer module and is accessible by the transfer mechanism of a module for positioning the workpiece. As noted, this makes the transfer module essentially a transfer measurement module (TMM) as discussed herein.

In one embodiment, and as will be discussed in more detail below, the common manufacturing platform 200 advantageously includes, and is controlled by, an "active interdiction control system." The active interdiction control system includes a workpiece measurement region within a transfer module 210*a*, 210*b* hosted on the common manufacturing platform 200 or within an integrated metrology module (not shown) hosted on the common manufacturing platform 200. The workpiece measurement region may be located in a dedicated area of the transfer module 210*a*, 210*b*, as described in more detail below. The workpiece measurement region or metrology module 240*a*, 240*b* may include an inspection system for gathering measurement data. As described in more detail below, the inspection system may include at least one optical source for directing an optical beam incident on a measurement surface of the workpiece and at least one detector arranged to receive an optical signal scattered from the measurement surface of the workpiece. The active interdiction control system may further include an intelligence system hosted on the common manufacturing platform 200 that is configured to gather data from the workpiece measurement region or metrology module and control the integrated sequence of processing steps executed on the common manufacturing platform 200, such as process flow 100.

For active interdiction in accordance with embodiments of the invention, the workpiece measurement region or metrology module collects real time data "on the fly" pertaining to attributes of features or layers on the semiconductor workpiece (e.g., film or feature thickness, feature depth, surface roughness, pattern shift, voids or other defects, loss of selectivity, lateral overgrowth, uniformity, etc.) and uses such real time data to concurrently control integration operating variables in the integrated processing modules hosted on the common manufacturing platform 200. The data can be used in a feed-back and/or feed-forward manner to control operations performed on the workpiece in subsequent modules and/or to control operations performed in prior modules on a subsequent workpiece. In an embodiment, the common manufacturing platform 200 includes a correction module, which may be a film-forming module 220*a*, 220*b*, an etching module 230*a*, 230*b*, or other type of treatment module as appropriate for applying corrective action or remedial treatment to the workpiece.

Unlike traditional metrology or process control, the workpiece does not leave the controlled environment to enter a stand-alone metrology tool thereby minimizing oxidation and defect generation, the measurements are non-destructive such that no workpiece is sacrificed to obtain data thereby maximizing production output, and the data can be collected in real time as part of the process flow to avoid negatively impacting production time and to enable in-process adjustments to the workpiece or to subsequent workpieces being sequentially processed on the common manufacturing platform 200. Additionally, the measurements are not performed in the film-forming 220*a*, 220*b* or etching modules 230*a*, 230*b*, thereby avoiding issues when measurement devices are exposed to process fluids. For example, by incorporating workpiece measurement regions into the transfer module 210*a*, 210*b*, the data can be obtained as the workpiece is traveling between processing tools with little to no delay in the process flow, without exposure to process fluids, and without leaving the controlled environment, e.g., without breaking vacuum. While the "on the fly" data may not be as accurate as the data obtained from traditional destructive methods performed in stand-alone metrology tools, the nearly instantaneous feedback on the process flow and ability to make real-time adjustment without interrupting the process flow or sacrificing yield is highly beneficial for high-volume manufacturing.

The active interdiction control system may include a single metrology module, such as measurement module 240*a* or measurement module 240*b*, or workpiece measurement region on the common manufacturing platform 200 or may include multiple metrology modules 240*a*, 240*b* or workpiece measurement regions on the common manufacturing platform 200, as will be discussed in more detail below. Each metrology operation is optional, as indicated by the phantom lines in FIG. 1, but may be advantageously performed at one or more points in the process flow to ensure the workpiece is within specification. In one embodiment, measurement data is obtained after each step of the integrated sequence of processing steps conducted on the common manufacturing platform. The measurement data may be used to repair the workpiece in a correction module prior to leaving the common manufacturing platform, and/or may be used to alter parameters of the integrated sequence of processing steps for subsequent steps and/or for subsequent workpieces.

Operation 104 includes conformally or selectively applying a first thin film on a surface of the workpiece using a film-forming module hosted on the common manufacturing platform.

Operation 150 includes optionally performing measurement/metrology to obtain measurement data related to attributes of the workpiece having the conformal or selective first thin film applied, such as attributes of the first thin film, the amount of fill material in the recessed feature, or the presence or amount of fill material on the upper planar surface of the workpiece, which measurement data may be used to adjust and/or control process parameters of any one of operations 104-108, may be used to make adjustments for subsequent workpieces to the incoming attributes in operation 106 or to operation 108, or may be used to repair the workpiece before continued processing. In one embodiment, when the measurement data indicates that one or more attributes do not meet a target condition, the workpiece may be transferred to a process module to repair the conformally or selectively applied first thin film. For example, when a conformality or uniformity of the first thin film does not meet a target conformality or target uniformity for the first thin film, corrective action may be taken in one or more process modules, such as removing the thin film and reapplying the thin film, conformally applying an additional thin film, etching the thin film, selectively applying an additional thin film, or a combination of two or more thereof.

With further reference to the process flow 100 of FIG. 1, the method may include inspecting the workpiece, such as performing metrology 150, 152, 108, i.e., obtaining measurement data, using the active interdiction control system at any of various times throughout the integrated method, without leaving the controlled environment, e.g., without breaking vacuum. Performing inspection or measurement 150, 152, 108 of the workpiece may include characterizing one or more attributes of the workpiece and determining whether the attribute meets a target condition. For example, the inspection 150, 152, 108 may include obtaining measurement data related to an attribute and determining whether a defectivity, thickness, uniformity, and/or selectivity condition meets a target for that condition. The active interdiction control system may include one or more measurement/metrology modules, TMMs, or workpiece measurement regions on the common manufacturing platform as discussed herein. The various measurement/metrology operations and following active interdiction steps may be optional at certain junctures, as indicated by the phantom lines in FIG. 1 for example but may be advantageously performed at one or more points in the process flow to ensure the workpiece is within specification. In one embodiment, measurement data is obtained after each step of the integrated sequence of processing steps conducted on the common manufacturing platform. The measurement data may be used to repair the workpiece in one or more active interdiction/remediation/correction modules prior to leaving the common manufacturing platform, and/or may be used to alter parameters of the integrated sequence of processing steps for subsequent steps and/or for subsequent workpieces. Alternatively or in addition, the measurement data may be used to change process parameters of the process modules either upstream or downstream from the module in which the measurement occurred.

In broad terms, within the controlled environment, measurement data may be obtained during the integrated sequence of processing steps related to the selective deposition of the fill material and, based on the measurement data, a determination may be made whether defectivity, thickness, uniformity, and/or selectivity of the layer of fill material meets a target condition. When the defectivity, thickness, uniformity, and/or selectivity is determined to not meet the target condition, or an attribute of the workpiece is otherwise determined to be non-conforming, the workpiece may be subjected to further active interdiction processing. For example, the workpiece may be processed in one or more modules that might be considered correction/remediation modules on the common manufacturing platform to remove, minimize, or compensate for the non-conforming attribute prior to performing a next processing step in the integrated sequence of processing steps. The corrective action may include etching the target surface or non-target surface, depositing further fill material on the workpiece, repairing a barrier layer on the workpiece, thermally treating the workpiece, or plasma treating the workpiece, for example. Other steps might also be part of the active interdiction depending on the detected non-conformity or defect.

Alternatively or in addition, the corrective action, when the defectivity, thickness, uniformity, and/or selectivity is determined to not meet the target condition, or an attribute of the workpiece is otherwise determined to be non-conforming, a corrective action may be taken upstream or downstream from the module that caused the nonconformity. For example, the integrated metrology or measurement components, together with in-situ equipment module diagnostics and virtual metrology, collects data on-wafer, and collects equipment data upstream and downstream within the process sequence flow. The data may be combined with equipment and process control models to create actionable information for predicting and detecting faults, predicting maintenance, stabilizing process variations, and correcting processes to achieve productivity and yield. To establish the equipment and process control models, all data is integrated, i.e., data from equipment module logs, transfer module logs, platform logs, fab host, etc., and combined with analytical techniques, including deep learning algorithms, to understand the relationships between equipment and process control parameters, and the process result on the substrate or wafer. An active interdiction control system that might be hosted in part in the common platform performs corrective processing in upstream and downstream processing modules to address detected non-conformities, defects, or other variations. This upstream/downstream corrective processing may be alternative or in addition to the real-time correction processes described above.

In one example, such as CMP-less interconnect manufacturing, the corrective action downstream from the measurement or metrology step in the common manufacturing platform may include removing the fill material deposited on the wafer or in the recessed feature when the non-conformity is based, at least in part, on incomplete or inaccurate filling of the recessed feature. In another example, the corrective action may include removing fill material from the surface of the wafer or the recessed feature when the non-conformity is based, at least in part, on an inaccurate composition of fill material. In yet another example, the corrective action may include adding further fill material to the workpiece when the non-conformity is based, at least in part, on a thickness of the fill material inside the recessed features being less than a predetermined thickness threshold. In a still further example, the corrective action may include etching the workpiece when the non-conformity is based, at least in part, on a remaining fill material outside of the recessed feature. In another example, the corrective action may include thermally treating or plasma treating the workpiece when the non-conforming workpiece attribute is based, at least in part, on a reflectivity from the workpiece being less than a predetermined reflectivity threshold.

The correction modules may be different film-forming and etching modules that are designated as correction modules on the common manufacturing platform or another type of treatment module integrated on the common manufacturing platform, such as a thermal annealing module, or may be the same film-forming and etching modules used to selectively deposit the fill material and etch the film nuclei.

Operation 106 includes removing the first thin film from upper surfaces of the workpiece using the etching module 230a, 230b hosted on the common manufacturing platform. Operation 108 includes performing metrology to obtain data related to attributes of the workpiece having removed the fill material from the upper planar surface of the workpiece, which data may be used to adjust and/or control process parameters of any one of operations 104-106 or may be used to make adjustments for subsequent workpieces to the incoming attributes of the workpieces in operation 102.

FIGS. 3A-3E show an example of a workpiece 300 having an upper planar surface 310 and a recessed feature 320. As explained below, a first conformal layer 330, a second conformal layer 340, and a filled recessed feature 350 are also illustrated in FIGS. 3B-3E. Each of the conformal layers 330 340 are deposited onto the upper planar surface 310 of the workpiece 300 and allowed to be deposited into the recessed feature 320 using any single or combination of deposition modules 220a, 220b.

FIGS. 4A-4E show an example of a workpiece 400 having an upper planar surface 410 and a recessed feature 420. As explained below, a first selective layer 430, miscellaneous material 435 from the first selective layer deposition, a second selective layer 440, miscellaneous material 445 from the second selective layer deposition, and a filled recessed feature 450 are also illustrated in FIGS. 4B-4E.

Figures 3A, 3B, 3C, 3D, 3E:
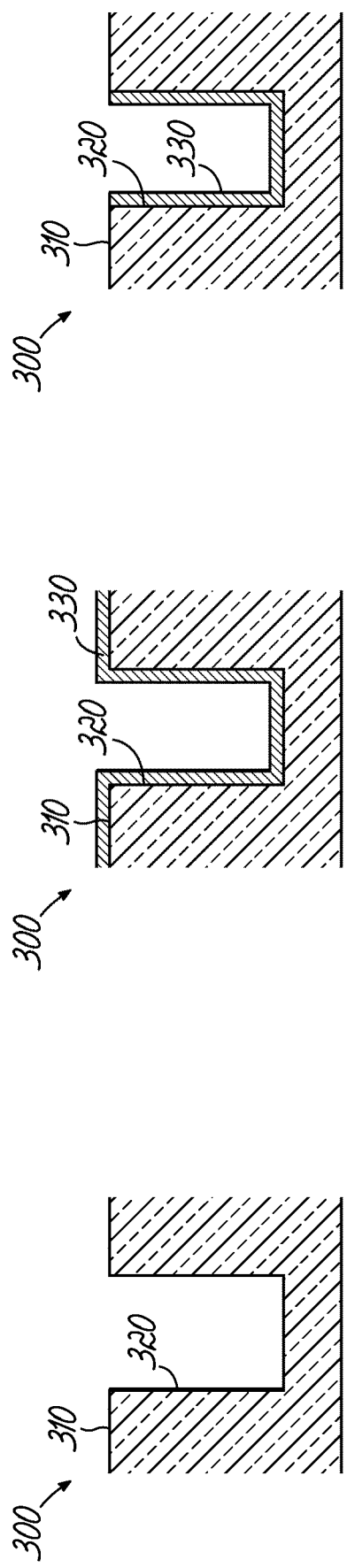
FIGS. 3A-3E are schematic cross-sectional diagrams illustrating one embodiment of a CMP-less interconnect manufacturing method.

In operation 104, in the film-forming module 220, a fill material is deposited over the upper planar surface 310, 410 and the at least one recessed feature 320, 420. As shown in FIG. 3B, the fill material may be the first conformal layer 330 deposited on the upper planar surface 310 of the workpiece 300. Additionally, depositing the first conformal layer 330 of fill material onto the workpiece 300 includes conformally depositing the fill material along the upper planar surface 310 and along sidewall surfaces and a bottom surface of the recessed feature 320. In another specific embodiment, a sacrificial film (not shown) may be formed in the recessed feature 320 overlying and co-planar with the first conformal layer 330, such that the upper surfaces of the sacrificial layer and first conformal layer 330 are exposed and capable of being treated by subsequent processes. For example, the exposed surfaces of the two films may be etched back to expose the upper planar surface 310, while minimizing the step-height distance between the upper planar surface 310 and the upper surface of the sacrificial film. However, co-planarization between the exposed surfaces is not required in other embodiments. For example, subsequent etch back processes may be optimized to create a desired step-height difference between the upper planar surface 310 and the sacrificial film's upper surface, wherein the exposed surface of the sacrificial film is recessed below the upper planar surface 310. In this embodiment, the sidewall of the recessed feature 320 may or may not have the first conformal layer 330 removed before proceeding to operation illustrated in FIG. 3D.

Figure 4A:
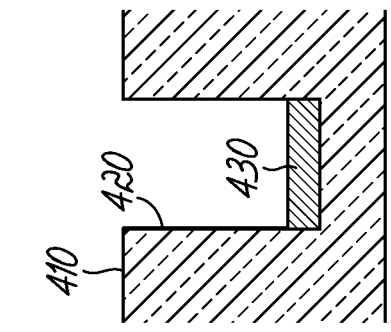
FIGS. 4A-4E are schematic cross-sectional diagrams illustrating one embodiment of a CMP-less interconnect manufacturing method.
Figure 4B:
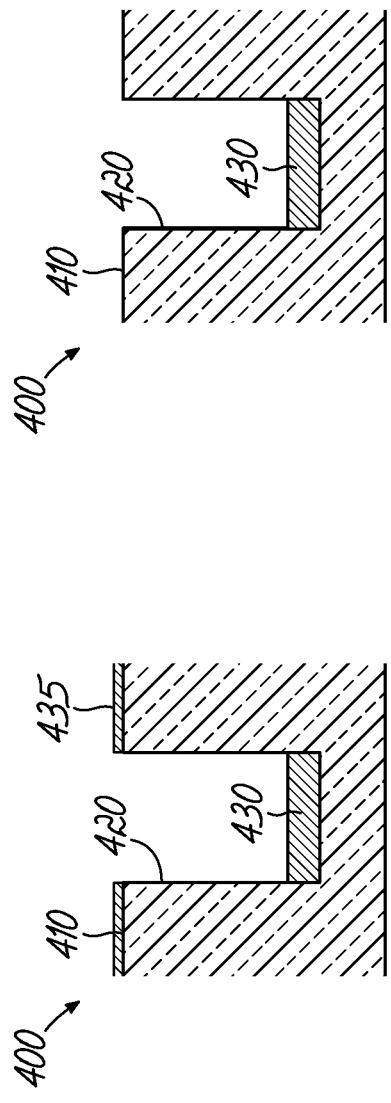

Alternatively, as shown in FIG. 4B the fill material may be the first selective layer 430 deposited onto the bottom surface of the recessed feature 420. In some examples, the method of deposition of the fill material may be chemical vapor deposition (CVD), physical vapor deposition (PVD), atomic layer deposition (ALD), or spin-coating or spin-on deposition. As a result of selective deposition, the miscellaneous material 435 may also be present on the upper planar surface 410 of the workpiece 400.

The fill material may include an oxide, a nitride, or silicon, for example, silicon nitride or silicon oxide. As shown, the common manufacturing platform 200 may include two identical film-forming modules 220a-b on opposing sides of the transfer module 210a. By mirroring the two sides of the platform 200, end-to-end processing can be achieved for two workpieces concurrently, and if one film-forming module 220 goes out of service temporarily, the platform 200 can continue to operate, at least at 50% capacity. Then, without breaking vacuum, transfer module 210a-b are used to transfer the workpiece to an etching module 230a-b also hosted on the common manufacturing platform 200, e.g., transfer module 210a removes the workpiece from film-forming module 220a and transfers it to transfer module 210b, which then delivers the workpiece into etching module 230a. Adjustments to the controlled environment may be made in transfer modules 210a and 210b if etching module 230a operates with different parameters than film-forming module 220a-b, such as different vacuum pressures.

In some examples, thereafter, and without breaking vacuum, in operation 152, additional measurements of the workpiece may be taken. Measurement data obtained in operation 152 may be obtained in real-time to determine various parameters or attributes of the workpiece 300, 400. In addition to the parameter or attribute data that may be obtained in operation 150, parameter or attribute data obtained in operation 152 may determine if the recessed feature 320, 420 is filled such that the fill material in the recessed feature is coplanar with the upper planar surface 310, 410 of the workpiece 300, 400. If the measurement data obtained in operation 152 indicates that the recessed feature 320, 420 is not filled such that fill material in the recessed feature 320, 420 is coplanar with the upper planar surface 310, 410 of the workpiece 300, 400, then operation 104 may be repeated to deposit additional fill material onto the workpiece 300, 400 using one of the film-forming modules 220a-b. Operation 152 may be performed after any number of operations 104 have been performed, or not at all. Thereafter, the measurement data may be used to adjust and/or control process parameters of any one of operations 104-106, including a sufficient fill thickness determination 180. For example, when the measurement data indicates that there is not adequate material deposited in the recessed feature 320, 420, such that the sufficient fill thickness determination 180 is No, the workpiece 300, 400 may be subjected to repeating operation 104. For example, the workpiece 300, 400 may be processed through a deposition module 220a, 220b to deposit additional fill material onto the upper planar surface 310, 410 of the workpiece 300, 400 and/or modify the contact feature thickness, width, and/or profile using the metrology data from operation 152. When the measurement data indicates that there is sufficient fill thickness, such that the recessed feature 320, 420 is sufficiently filled, the sufficient fill thickness determination 180 is Yes, the workpiece 300, 400 advances to the next operation (e.g., operation 106).

While the common manufacturing platform 200 may incorporate one or more measurement modules 240a, 240b in combination with processing modules such as etch modules 230a, 230b and film-forming modules 220a, 220b, in accordance with another embodiment of the invention, the functionality of the measurement/metrology module 240a, 240b is incorporated within the transfer module 210a, 210b that may move workpieces 300, 400 through the various processing modules according to a processing sequence. More specifically, the transfer modules 210a, 210b generally includes a transfer chamber defining an internal space that holds a transfer mechanism, such as a robot, to move workpieces 300, 400 through the transfer module 210a, 210b and into and out of selected processing modules. In accordance with the feature of the invention, a measurement region is located within a dedicated area of a transfer chamber internal space. The measurement region is accessible by the transfer mechanism for positioning a workpiece in the measurement region for the purposes of obtaining measurement data. More specifically, the workpiece 300, 400 may be positioned in the measurement region before or after the workpiece 300, 400 has been processed in a processing module in order to determine the particular results of a processing step or the overall processing sequence up to that point. An inspection system is configured to engage the workpiece that is positioned in the measurement region. The inspection system is operable for measuring data that is associated with an attribute on the workpiece in accordance with features of the invention. As discussed further herein, the transfer mechanism may place the substrate on a separate support mechanism located within the measurement region for taking the measurement. Alternatively, the transfer mechanism itself my act as a support mechanism and move and position the workpiece in the appropriate measurement region for engagement by the inspection system. Accordingly, a separate measurement module 240a, 240b is not necessary. Rather, the real estate within the transfer chamber of the transfer module 210a, 210b provides access to a workpiece for measurement.

Measurement data obtained in operation 152 may be obtained in the designated space of the real estate of the TMMs 210a, 210b, while the workpiece 300, 400 is being transferred to other modules. Alternatively or in addition, measurement data obtained in operation 152 may be obtained in dedicated measurement modules 240*a*, 240*b*, separate from the transfer modules 210*a*, 210*b*.

Figure 4C:
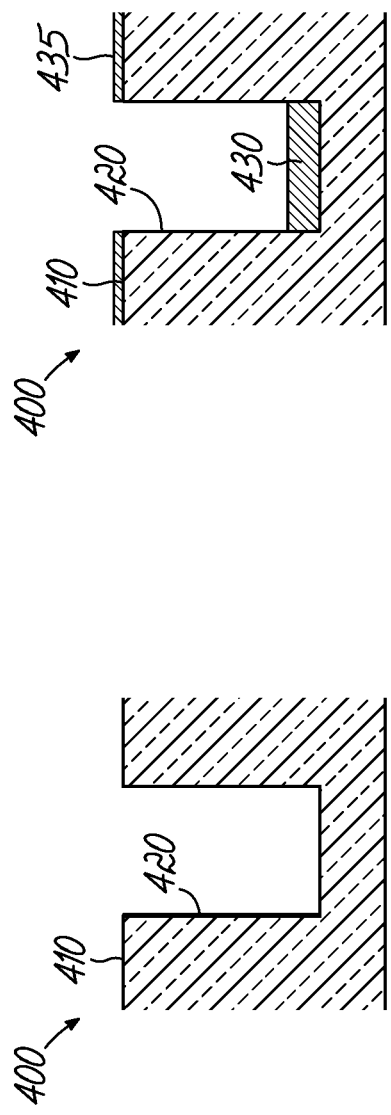

In operation 106, in examples where the first conformal layer 330 has been deposited on the workpiece 300, the first conformal layer 330 on the upper planar surface 310 is etched to leave behind the first conformal layer 330 within the recessed feature 320 and remove the first conformal layer 330 from the upper planar surface 310 of the workpiece 300, as shown in FIG. 3C. Alternatively, in examples where the miscellaneous material 435 is present on the upper planar surface 410 of the workpiece 400, the miscellaneous material 435 is etched to remove the miscellaneous material 435 and leave behind the first selective layer 430 in the recessed feature 420, as shown in FIG. 4C. The etch performed in operation 106 does not require or utilize CMP, making the process CMP-less. Rather, at least because vacuum may not be broken for any of the operations 102-106, the fill material may be removed without the use of CMP, advantageously avoiding corrosive slurries and/or abrasive materials that may be harmful to workpiece surfaces.

Thereafter, and again without breaking vacuum, in operation 108, the workpiece 300, 400 is measured to determine if the recessed feature 320, 420 is filled. The measurement data obtained in operation 108 may be obtained in real-time and may be used to determine whether the fill material 330, 435 has been removed from the upper planar surface 310, 410 of the workpiece. If the measurement data obtained in operation 108 indicates that the fill material 330, 435 has not been removed from the upper planar surface 310, 410, then operation 106 may be repeated to etch the fill material 330, 435 from the upper planar surface 310, 410 of the workpiece 300, 400 using one or more of the etching modules 230*a*-*b*. Operation 108 may then performed again to measure whether the fill material 330, 435 has been removed from the upper planar surface of the workpiece 300, 400. Thereafter, the measurement data may be used to adjust and/or control process parameters of any one of operations 104-106, including a fill material remaining on the upper planar surface of the workpiece determination 182. For example, when the measurement data indicates that fill material remains on the upper planar surface 310, 410 of the workpiece 300, 400 the fill material remaining on the upper planar surface determination 182 is Yes, and the workpiece 300, 400 may be subjected to repeating operation 106. For example, the workpiece 300, 400 may be processed through an etching module 230*a*, 230*b* to remove fill material remaining on the upper planar surface 310, 410 of the workpiece 300, 400 and/or modify the contact feature thickness, width, and/or profile using the metrology data from operation 108. When the measurement data indicates that there is no remaining fill material on the upper planar surface 310, 410 of the workpiece 300, 400, the fill material remaining on the upper planar surface determination 182 is No, and the workpiece 300, 400 advances to the next operation (e.g., operation 184).

Again, while the common manufacturing platform 200 may incorporate one or more measurement modules 240*a*, 240*b* in combination with processing modules such as etch modules 230*a*, 230*b* and film-forming modules 220*a*, 220*b*, in accordance with another embodiment of the invention, the functionality of the measurement/metrology module 240*a*, 240*b* is incorporated within the transfer module 210*a*, 210*b* that may move workpieces 300, 400 through the various processing modules according to a processing sequence. More specifically, the transfer modules 210*a*, 210*b* generally includes a transfer chamber defining an internal space that holds a transfer mechanism, such as a robot, to move workpieces 300, 400 through the transfer module 210*a*, 210*b* and into and out of selected processing modules. In accordance with the feature of the invention, a measurement region is located within a dedicated area of a transfer chamber internal space. The measurement region is accessible by the transfer mechanism for positioning a workpiece in the measurement region for the purposes of obtaining measurement data. More specifically, the workpiece 300, 400 may be positioned in the measurement region before or after the workpiece 300, 400 has been processed in a processing module in order to determine the particular results of a processing step or the overall processing sequence up to that point. An inspection system is configured to engage the workpiece that is positioned in the measurement region. The inspection system is operable for measuring data that is associated with an attribute on the workpiece in accordance with features of the invention. As discussed further herein, the transfer mechanism may place the substrate on a separate support mechanism located within the measurement region for taking the measurement. Alternatively, the transfer mechanism itself my act as a support mechanism and move and position the workpiece in the appropriate measurement region for engagement by the inspection system. Accordingly, a separate measurement module 240*a*, 240*b* is not necessary. Rather, the real estate within the transfer chamber of the transfer module 210*a*, 210*b* provides access to a workpiece for measurement.

Measurement data obtained in operation 108 may be obtained in the designated space within the real estate of TMMs 210*a*, 210*b*, while the workpiece 300, 400 is being transferred to other modules. Alternatively or in addition, measurement data obtained in operation 108 may be obtained in dedicated measurement modules 240*a*, 240*b*, separate from the transfer modules 210*a*, 210*b*.

In operation 184, the measurement data obtained in operation 108 may be used to form a recessed feature filled determination 184. For example, when the measurement data indicates that the fill material 350, 450 in the recessed feature 320, 420 is planar with the upper planar surface 310, 410 of the workpiece 300, 400, the recessed feature filled determination 184 is Yes, and the process flow 100 ends. When the measurement data indicates that the fill material in the recessed feature 320, 420 is not planar with the upper planar surface 310, 410, the recessed feature filled determination 184 is No, and the workpiece 300, 400 is subjected to further repeated deposition of fill material in operation 104 or the workpiece 300, 400 is subjected to repeated etching of fill material in operation 106. In some embodiments, at least one repetition of operation 104 and operation 106 will occur in the process flow 100.

After etching the first conformal layer 330 or the miscellaneous material 435 from the upper planar surface 310, 410 of the workpiece 300, 400, if the recessed feature 320, 420 is not filled such that the fill material is planar with the upper planar surface 310, 410, a second conformal layer 340 or a second selective layer 440 is deposited onto the workpiece 300, 400. In the film-forming module 220, a second layer of fill material is deposited over the upper planar surface 310, 410 and the at least one recessed feature 320, 420. As shown in FIG. 3D, the fill material may be the second conformal layer 340 deposited on the upper planar surface 310 of the workpiece 300. Additionally, depositing the second conformal layer 340 of fill material onto the workpiece 300 includes conformally depositing the fill material along the upper planar surface 310 and along surfaces of the first conformal layer 330 within the recessed feature 320.

Figure 4E:
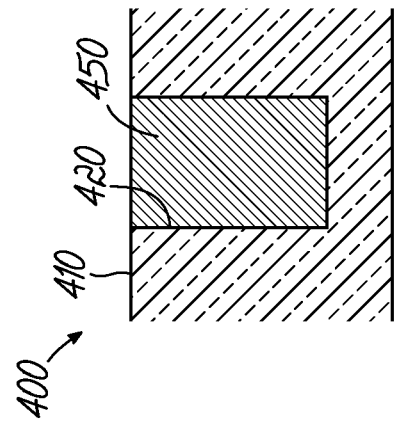
Figure 4D:
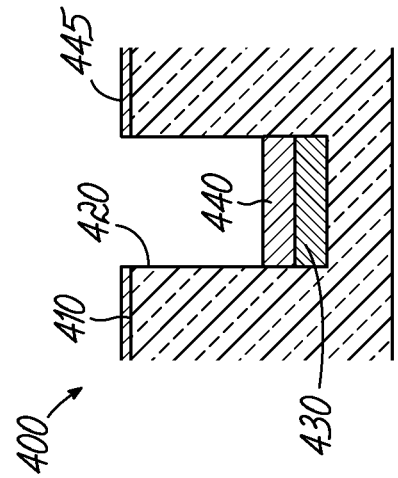

Alternatively, as shown in FIG. 4D, the fill material may be the second selective layer 440 deposited onto the surface of the first selective layer 430. In some examples, the method of deposition of the fill material may be chemical vapor deposition (CVD), physical vapor deposition (PVD), atomic layer deposition (ALD), or spin-coating or spin-on deposition. As a result of selective deposition, the miscellaneous material 445 may also be present on the upper planar surface 410 of the workpiece 400.

Similar to operation 106 regarding the first conformal layer 320 or the first miscellaneous material 435, the second conformal layer 340 is etched to leave behind the first conformal layer 330 and the second conformal layer 340 in the recessed feature 320, or, alternatively, the second miscellaneous material 445 is etched to leave behind the first selective layer 430 and the second selective layer 440 in the recessed feature. The etch performed does not require or utilize CMP, making the process CMP-less. Rather, at least because vacuum may not be broken for any of the operations, the fill material may be removed from the upper planar surface 310, 410 of the substrate without the use of CMP, advantageously avoiding corrosive slurries and/or abrasive materials that may be harmful to workpiece surfaces.

Thereafter, and again without breaking vacuum, similar to operation 108, the workpiece 300, 400 is measured to determine if the recessed feature 320, 420 is filled. The measurement data obtained may be obtained in real-time and may be used to determine whether the fill material 340, 445 has been removed from the upper planar surface 310, 410 of the workpiece. If the measurement data obtained indicates that the fill material 340, 445 has not been removed from the upper planar surface 310, 410, the remaining fill material 340, 445 from the upper planar surface 310, 410 of the workpiece 300, 400 may be etched away using one or more of the etching modules 230a-b. Measurements may be performed again to determine whether the fill material 340, 445 has been removed from the upper planar surface of the workpiece 300, 400.

As explained above, the process flow 100 of deposition of fill material onto the upper planar surface 310, 410 of the workpiece 300, 400, either conformally or selectively, in operation 104 and the etch of material off of the upper planar surface 310, 410 in operation 106, and measurement in operation 152 and operation 108, is repeated until the recessed feature 320, 420 is filled with fill material, and the filled recessed feature 350, 450, is planar with the upper planar surface 310, 410, as shown in FIGS. 3E and 4E, and the recessed feature fill determination 184 is Yes.

In the embodiments described above, the fill material may include, but is not limited to, ruthenium, tungsten, cobalt, nickel, molybdenum, aluminum, niobium, titanium, copper, or a combination thereof.

Process parameters, as referred to above, may include any operating variable within a processing module, such as but not limited to: gas flow rates; compositions of etchants, deposition reactants, purge gases, etc.; chamber pressure; temperature; electrode spacing; power; etc. The intelligence system of the active interdiction control system is configured to gather data from the inspection system and control the integrated sequence of processing steps executed on the common manufacturing platform, for example, by making in situ adjustments to processing parameters in subsequent processing modules for the workpiece in process, or by changing process parameters in one or more processing modules for subsequent workpieces.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

The subject-matter of the disclosure may also relate, among others, to the following aspects:

1. A method of processing materials on a semiconductor workpiece using an integrated sequence of processing steps executed on a common manufacturing platform hosting a plurality of processing modules including one or more film-forming modules, one or more etching modules, and one or more transfer modules, the integrated sequence of processing steps comprising:

receiving the workpiece into the common manufacturing platform, the workpiece having an upper planar surface and at least one recessed feature therein;

depositing a fill material onto the workpiece in one of the one or more film-forming modules hosted on the common manufacturing platform such that the fill material is deposited into the recessed feature;

etching the workpiece in one of the one or more etching modules hosted on the common manufacturing platform to remove any fill material deposited on the upper planar surface and to leave behind the fill material in the recessed feature; and obtaining measurement data to determine if the fill material in the recessed feature is coplanar with the upper planar surface, or to determine if the fill material has been removed from the upper planar surface, or both, and repeating the depositing, etching, and measuring until the fill material in the recessed feature is coplanar with the upper planar surface, wherein the obtaining measurement data is performed in a workpiece measurement region located within a dedicated area of at least one of the one or more transfer modules or within a metrology module hosted on the common manufacturing platform, and wherein the integrated sequence of processing steps is executed in a controlled environment within the common manufacturing platform and without leaving the controlled environment, and wherein the one or more transfer modules are used to transfer the workpiece between the plurality of processing modules while maintaining the workpiece within the controlled environment.

2. The method of aspect 1, wherein depositing the fill material comprises conformally depositing a conformal layer of the fill material along the upper planar surface and along sidewall surfaces and a bottom surface of the recessed feature, and wherein etching the workpiece includes removing the conformal layer from at least the upper planar surface while leaving the conformal layer on the bottom surface.

3. The method of aspect 2, wherein the controlled environment includes a vacuum environment, an inert gas atmosphere, or a combination thereof 4. The method of any of aspects 2 to 3, wherein the workpiece measurement region is located in at least one of the one or more transfer modules.

5. The method of any of aspects 2 to 4, wherein the workpiece measurement region is located in the metrology module.

6. The method of any of aspects 2 to 5, further comprising:

using an intelligence system hosted on the common manufacturing platform, controlling the integrated sequence of processing steps executed on the common manufacturing platform based on the determination of whether the recess is filled.

7. The method of any of aspects 2 to 6, wherein obtaining the measurement data includes:
   directing an optical beam from at least one optical source incident on a measurement surface of the workpiece; and
   receiving an optical signal scattered from the measurement surface of the workpiece into at least one detector.

8. The method of any of aspects 2 to 7, wherein the integrated sequence of processing steps is executed without chemical-mechanical planarization of the upper planar surface.

9. The method of any of aspects 2 to 8, wherein the common platform includes at least two deposition modules, at least two metrology modules, and at least two etching modules.

10. The method of any of aspects 2 to 9, wherein the fill material is ruthenium, tungsten, cobalt, nickel, molybdenum, aluminum, niobium, titanium, copper, or a combination thereof 11. The method of aspect 1, wherein depositing the fill material comprises selectively depositing the fill material onto a bottom surface of the recessed feature, and wherein etching the workpiece includes removing any fill material deposited as a contaminant on the upper planar surface.

12. The method of aspect 11, wherein the controlled environment includes a vacuum environment, an inert gas atmosphere, or a combination thereof 13. The method of any of aspects 11 to 12, wherein the workpiece measurement region is located in at least one of the one or more transfer modules.

14. The method of any of aspects 11 to 13, wherein the workpiece measurement region is located in the metrology module.

15. The method of any of aspects 11 to 14, wherein obtaining the measurement data includes:
   directing an optical beam from at least one optical source incident on a measurement surface of the workpiece; and
   receiving an optical signal scattered from the measurement surface of the workpiece into at least one detector.

16. The method of any of aspects 11 to 15, wherein the common platform includes at least two deposition modules, at least two metrology modules, and at least two etching modules.

17. The method of any of aspects 11 to 16, further comprising:
   using an intelligence system hosted on the common manufacturing platform, controlling the integrated sequence of processing steps executed on the common manufacturing platform based on the obtained determination of whether the recess is filled.

18. The method of any of aspects 11 to 17, wherein the integrated sequence of processing steps is performed without chemical-mechanical planarization of the upper planar surface.

19. The method of any of aspects 11 to 18, wherein the fill material has an affinity for a material included in the recessed feature.

20. The method of any of aspects 11 to 19, wherein the fill material is ruthenium, tungsten, cobalt, nickel, molybdenum, aluminum, niobium, titanium, copper, or a combination thereof.

What we claim:

1. A method of processing materials on a semiconductor workpiece using an integrated sequence of processing steps executed on a common manufacturing platform hosting a plurality of processing modules including one or more film-forming modules, one or more etching modules, and one or more transfer modules, the integrated sequence of processing steps comprising:
   receiving the workpiece into the common manufacturing platform, the workpiece having an upper planar surface and at least one recessed feature therein;
   depositing a fill material onto the workpiece in one of the one or more film-forming modules hosted on the common manufacturing platform such that the fill material is deposited into the recessed feature;
   etching the workpiece in one of the one or more etching modules hosted on the common manufacturing platform to remove any fill material deposited on the upper planar surface and to leave behind the fill material in the recessed feature; and
   obtaining measurement data to determine if the fill material in the recessed feature is coplanar with the upper planar surface, or to determine if the fill material has been removed from the upper planar surface, or both, and
   repeating the depositing, etching, and measuring until the fill material in the recessed feature is coplanar with the upper planar surface,
   wherein the obtaining measurement data is performed in a workpiece measurement region located within a dedicated area of at least one of the one or more transfer modules or within a metrology module hosted on the common manufacturing platform,
   wherein the integrated sequence of processing steps is executed in a controlled environment within the common manufacturing platform and without leaving the controlled environment, and wherein the one or more transfer modules are used to transfer the workpiece between the plurality of processing modules while maintaining the workpiece within the controlled environment,
   wherein depositing the fill material comprises conformally depositing a conformal layer of the fill material along the upper planar surface and along sidewall surfaces and a bottom surface of the recessed feature, and
   wherein etching the workpiece includes removing the conformal layer from at least the upper planar surface while leaving the conformal layer on the bottom surface.

2. The method of claim 1, wherein the controlled environment includes a vacuum environment, an inert gas atmosphere, or a combination thereof.

3. The method of claim 1, wherein the workpiece measurement region is located in at least one of the one or more transfer modules.

4. The method of claim 1, wherein the workpiece measurement region is located in the metrology module or the etching module.

5. The method of claim 1, further comprising:
   using an intelligence system hosted on the common manufacturing platform, and controlling the integrated sequence of processing steps executed on the common manufacturing platform based on the determination of whether the recess is filled.

6. The method of claim 1, wherein obtaining the measurement data includes:
   directing an optical beam from at least one optical source incident on a measurement surface of the workpiece; and
   receiving an optical signal scattered from the measurement surface of the workpiece into at least one detector.

7. The method of claim 1, wherein the integrated sequence of processing steps is executed without chemical-mechanical planarization of the upper planar surface.

8. The method of claim 1, wherein the common manufacturing platform includes at least two deposition modules, at least two metrology modules, and at least two etching modules.

9. The method of claim 1, wherein the fill material is ruthenium, tungsten, cobalt, nickel, molybdenum, aluminum, niobium, titanium, copper, or a combination thereof.

10. A method of processing materials on a semiconductor workpiece using an integrated sequence of processing steps executed on a common manufacturing platform hosting a plurality of processing modules including one or more film-forming modules, one or more etching modules, and one or more transfer modules, the integrated sequence of processing steps comprising:
    receiving the workpiece into the common manufacturing platform, the workpiece having an upper planar surface and at least one recessed feature therein;
    depositing a fill material onto the workpiece in one of the one or more film-forming modules hosted on the common manufacturing platform such that the fill material is deposited into the recessed feature;
    etching the workpiece in one of the one or more etching modules hosted on the common manufacturing platform to remove any fill material deposited on the upper planar surface and to leave behind the fill material in the recessed feature; and
    repeating the depositing, etching, and measuring until the fill material in the recessed feature is coplanar with the upper planar surface,
    wherein the integrated sequence of processing steps is executed in a controlled environment within the common manufacturing platform and without leaving the controlled environment, and wherein the one or more transfer modules are used to transfer the workpiece between the plurality of processing modules while maintaining the workpiece within the controlled environment,
    wherein depositing the fill material comprises conformally depositing a conformal layer of the fill material along the upper planar surface and along sidewall surfaces and a bottom surface of the recessed feature, and
    wherein etching the workpiece includes removing the conformal layer from at least the upper planar surface while leaving the conformal layer on the bottom surface.

11. A method of processing materials on a semiconductor workpiece using an integrated sequence of processing steps executed on a common manufacturing platform hosting a plurality of processing modules including one or more film-forming modules, one or more etching modules, and one or more transfer modules, the integrated sequence of processing steps comprising:
    receiving the workpiece into the common manufacturing platform, the workpiece having an upper planar surface and at least one recessed feature therein;
    depositing a fill material onto the workpiece in one of the one or more film-forming modules hosted on the common manufacturing platform such that the fill material is deposited into the recessed feature;
    etching the workpiece in one of the one or more etching modules hosted on the common manufacturing platform to remove any fill material deposited on the upper planar surface and to leave behind the fill material in the recessed feature; and
    obtaining measurement data to determine if the fill material in the recessed feature is coplanar with the upper planar surface, or to determine if the fill material has been removed from the upper planar surface, or both, and
    repeating the depositing, etching, and measuring until the fill material in the recessed feature is coplanar with the upper planar surface,
    wherein the obtaining measurement data is performed in a workpiece measurement region located within a dedicated area of at least one of the one or more transfer modules or within a metrology module hosted on the common manufacturing platform,
    wherein the integrated sequence of processing steps is executed in a controlled environment within the common manufacturing platform and without leaving the controlled environment, and wherein the one or more transfer modules are used to transfer the workpiece between the plurality of processing modules while maintaining the workpiece within the controlled environment,
    wherein depositing the fill material comprises selectively depositing the fill material onto a bottom surface of the recessed feature, and wherein etching the workpiece includes removing any fill material deposited as a contaminant on the upper planar surface, and
    wherein obtaining the measurement data includes
       directing an optical beam from at least one optical source incident on a measurement surface of the workpiece; and
       receiving an optical signal scattered from the measurement surface of the workpiece into at least one detector.

12. The method of claim 11, wherein the controlled environment includes a vacuum environment, an inert gas atmosphere, or a combination thereof.

13. The method of claim 11, wherein the workpiece measurement region is located in at least one of the one or more transfer modules.

14. The method of claim 11, wherein the workpiece measurement region is located in the metrology module or the etching module.

15. The method of claim 11, wherein the common platform includes at least two deposition modules, at least two metrology modules, and at least two etching modules.

16. The method of claim 11, wherein the integrated sequence of processing steps is performed without chemical-mechanical planarization of the upper planar surface.

17. The method of claim 11, wherein the fill material has an affinity for a material included in the recessed feature.

18. The method of claim 11, wherein the fill material is ruthenium, tungsten, cobalt, nickel, molybdenum, aluminum, niobium, titanium, copper, or a combination thereof.

* * * * *